(12) United States Patent
Kataoka

(10) Patent No.: US 6,367,152 B1
(45) Date of Patent: Apr. 9, 2002

(54) METHOD FOR MANUFACTURING A HEAT SINK

(76) Inventor: Hiromi Kataoka, 36-3, Nishifunatsu, Fuji-shi, Shizuoka (JP)

( * ) Notice: Subject to any disclaimer, the term of this patent is extended or adjusted under 35 U.S.C. 154(b) by 0 days.

(21) Appl. No.: 09/613,737

(22) Filed: Jul. 11, 2000

(30) Foreign Application Priority Data

Jul. 13, 1999 (JP) .......................................... 11-199001

(51) Int. Cl.⁷ ............................................... B23P 15/26
(52) U.S. Cl. .................... 29/890.03; 165/185; 165/80.3
(58) Field of Search ....................... 29/890.03; 165/80.3, 165/185

(56) References Cited

U.S. PATENT DOCUMENTS

| | | | | |
|---|---|---|---|---|
| 6,032,362 A | * | 3/2000 | Okikawa et al. | 29/890.03 |
| 6,088,917 A | * | 7/2000 | Lee et al. | 165/185 |
| 6,134,783 A | * | 10/2000 | Bargman et al. | 29/890.03 |
| 6,202,303 B1 | * | 3/2001 | Trobough | 29/890.03 |

* cited by examiner

Primary Examiner—I Cuda-Rosenbaum
(74) Attorney, Agent, or Firm—Lerner, David, Littenberg, Krumholz & Mentlik, LLP

(57) ABSTRACT

A heat sink capable of permitting heat transfer from an electronic component to the heat sink to be effectively promoted while reducing a manufacturing cost of the heat sink and increasing yields thereof. Also, a method for manufacturing such a heat sink. The heat sink includes a base plate adaptable to be kept in direct contact with an electronic component which requires that heat be dissipated therefrom during operation thereof and radiation fins arranged so as to project from the base plate. The base plate includes a main base plate section made of a main material of which the radiation fins are made and a heat transfer promoting base plate section made of a heat transfer promoting material different from the material of which the main base plate section is made. The heat transfer promoting material is integrated with said main material at a stage at which working of a workpiece. This permits heat generated from the electronic component to be dispersed over the whole heat transfer base plate section and then transferred through the whole main base plate section to the radiation fins, so that the heat sink may be increased in heat dissipation efficiency.

8 Claims, 8 Drawing Sheets

METHOD FOR MANUFACTURING A HEAT SINK

BACKGROUND OF THE INVENTION

This invention relates to a heat sink for promoting heat dissipation from a large-scaled integrated circuit or the like, and more particularly to a heat sink exhibiting enhanced cooling efficiency and a method for effectively and economically manufacturing the same.

The inventor has made research and development of a heat sink for enhancing heat dissipation of a large-scaled integrated circuit or the like and, as a result, has filed many patent applications. Heat sinks thus proposed by the inventor are each formed by subjecting, for example, an aluminum material to plastic working, to thereby raise a number of fins from a base section. A configuration of the heat sink such as a height of the radiation fins or the like which directly affects cooling performance of the heat sink permits the heat sink to exhibit novelty and originality which are never anticipated from the prior art.

Such a heat sink is mainly used as a heat dissipation element for a CPU of a personal computer or the like. In the market, a personal computer tends to be requested to exhibit a further increased processing speed, therefore, currently an increase in generation of heat from a CPU or the like due to increases in clock frequency and the number of gates is unavoidable.

In order to further enhance heat dissipation efficiency from an electronic component in view of such current circumstances, it is carried out to use a heat sink having a bottom surface area several times as large as an upper surface area of a package of a CPU or the like, which is so constructed that a metal plate made of a metal material increased in thermal conductivity as compared with a material for the heat sink is interposed between the upper surface of the package and a bottom surface of a base plate of the heat sink.

Now, such construction will be described with reference to FIGS. 9A and 9B by way of example. A heat sink 1' includes a base plate 2', which is fixedly mounted on a bottom surface thereof with a metal plate 6' having the same shape as the bottom surface of the base plate 2' by any suitable techniques such as brazing, screwing or the like. Then, the heat sink 1' is securely fixed through the metal plate 6' to an upper surface of a package of an electronic component E' such as a CPU or the like while being kept in contact with the upper surface of the package.

Such construction permits heat generated from the electronic component E' to be diffused or dispersed over a whole region of the metal plate 6' and then transferred to the whole bottom surface of the heat sink 1', resulting in heat dissipation of the heat sink 1' being carried out with improved efficiency.

However, the above-described screwing which takes place for fixing of the metal plate 6' to the bottom surface of the base plate 2' causes the number of parts for the fixing and the number of steps therefor to be increased, leading to an increase in manufacturing cost of the heat sink. Also, it is highly difficult to carry out the fixing while keeping the whole metal plate 6' in intimate or close contact with the whole bottom surface of the base plate 2', to thereby cause loss in heat transfer, resulting in it failing in a satisfactory improvement in performance of the heat sink.

Also, the brazing taking place for the fixing requires a pretreatment prior to the brazing. More particularly, prior to the brazing, it is required to subject a joint surface of the base plate 2' of the heat sink 1' made of an aluminum material to a surface treatment such as plating, metal spraying or the like to permit the joint surface of the heat sink to be ready for the brazing. Unfortunately, the pretreatment with respect to the heat sink 1' having the radiation fins 3' already formed thereon causes not only a manufacturing cost to be highly increased but a reduction in strength of the radiation fins 3' and deformation thereof due to softening of the radiation fins 3' by heating during the brazing.

Further, fixing of the metal plate 6' to the bottom surface of the base plate 2' is often carried out by post-attaching the metal plate 6' to the heat sink 1' after formation of the heat sink 1'. Unfortunately, this frequently causes inadvertent bending of the radiation fins 3' which are inherently delicate, leading to a deterioration in yields of the heat sink.

SUMMARY OF THE INVENTION

The present invention has been made in view of the foregoing disadvantages of the prior art.

Accordingly, it is an object of the present invention to provide a heat sink which is capable of promoting heat transfer from a heat generating element to the heat sink while realizing a reduction in manufacturing cost of the heat sink and an increase in yields thereof.

It is another object of the present invention to provide a method for manufacturing a heat sink which method is capable of providing a heat sink realizing the above-described object.

In accordance with one aspect of the present invention, a heat sink is provided. The heat sink includes a base plate adaptable to be kept in direct contact with an electronic component which requires that heat be dissipated therefrom during operation thereof and radiation fins arranged so as to project from the base plate. The base plate includes a main base plate section made of a main material of which the radiation fins are made and a base plate section for promoting heat transfer (hereinafter referred to as "heat transfer promoting base plate section") made of a heat transfer promoting material different from the material for the main base plate section. The heat transfer promoting material is previously integrated with the main material at a stage at which working of a workpiece is started.

The above-described construction of the heat sink permits heat generated from an electronic component to be diffused or dispersed over the whole heat transfer promoting base plate section and then transferred through the whole main base plate section to the radiation fins, so that the heat sink may be increased in heat dissipation efficiency.

The heat transfer promoting material is previously integrated with the main material at a stage at which working of the workpiece is started. This ensures that the heat transfer promoting base plate section is formed integrally with the main base plate section concurrently with forming of the heat sink, to thereby eliminate parts such as screws or the like for fixing of the heat transfer promoting base plate section to the main base plate section and operation for the fixing, resulting in a manufacturing cost of the heat sink being reduced and inadvertent bending of the radiation fins which are intrinsically delicate being prevented.

In accordance with this aspect of the present invention, a heat sink is provided. The heat sink includes a base plate adaptable to be kept in direct contact with an electronic component which requires that heat be dissipated therefrom during operation thereof and radiation fins arranged so as to project from the base plate. The base plate is constituted by only a heat transfer base plate section made of a heat transfer promoting material. The radiation fins are made of a main material and arranged so as to project from the heat transfer promoting base plate section. The heat transfer promoting material is previously integrated with the main material at a stage at which working of a workpiece is started. The heat sink thus constructed permits heat generated from the electronic component to be efficiently dissipated from the radiation fins.

In a preferred embodiment of the present invention, the main material is aluminum alloy and the heat transfer promoting material is a material having thermal conductivity larger than that of aluminum. Such construction promotes that heat generated from the electronic component is diffused or dispersed over the whole heat transfer promoting base plate section and then transferred through the main base plate section to the radiation fins, to thereby enhance heat dissipation efficiency of the heat sink.

In a preferred embodiment of the present invention, the heat transfer promoting material is selected from the group consisting of copper and an alloy thereof. Such construction permits heat generated from the electronic component to be efficiently dispersed or diffused over the whole heat transfer promoting base plate section.

In a preferred embodiment of the present invention, the main material and heat transfer promoting material are coupled together by techniques selected from the group consisting of brazing, pressure welding by forging, deformation together with intermeshing and any combination thereof. Such construction permits the heat transfer promoting material to be in intimate or close contact with the main material, so that heat generated from the electronic component may be effectively dispersed or diffused over the whole heat transfer promoting base plate section.

In a preferred embodiment of the present invention, the heat transfer promoting material is coupled to the main material by plating the heat transfer promoting material on the main material. Such construction permits the heat transfer promoting material to be in more intimate contact with the main material, so that heat generated from the electronic component may be dispersed or diffused over the whole heat transfer promoting base plate section with enhanced efficiency.

In a preferred embodiment of the present invention, the main material and heat transfer promoting material are formed at a joint portion thereof through which both materials are coupled together with a means for increasing a contact area therebetween. Thus, efficient heat transfer from the heat transfer promoting base plate section to the main base plate section may be ensured.

In accordance with another aspect of the present invention a method for manufacturing a heat sink is provided. The method includes the step of subjecting a workpiece to forging under pressure in a die to form a base plate and radiation fins projecting from the base plate. The workpiece is made of a main material and a heat transfer promoting material having thermal conductivity larger than that of the main material. The radiation fins are constituted of the main material. Also, the base plate may be constituted of the main material depending on a form of the heat sink as desired. The heat transfer promoting material is integrally provided on a surface of the main material opposite to a surface of the main material on which the radiation fins are formed.

The method of the present invention thus constructed permits the heat transfer promoting base plate section to be formed integrally with the main base plate section concurrently with forming of the heat sink, to thereby eliminate parts such as screws or the like for fixing of the heat transfer base plate section to the main base plate section and operation for the fixing, resulting in a manufacturing cost of the heat sink being reduced and inadvertent bending of the radiation fins which are intrinsically delicate being prevented.

In a preferred embodiment of the present invention, the main material and heat transfer promoting material are previously formed integrally with each other by brazing. This ensures that the heat transfer promoting material is kept in intimate or close contact with the main material, so that heat generated from the electronic component may be effectively dispersed over the whole heat transfer promoting base plate section.

In a preferred embodiment of the present invention, the main material and heat transfer promoting material are previously formed integrally with each other by plating of the heat transfer material on the main material. This permits the heat transfer promoting material to be kept in more intimate contact with the main material, so that heat generated from the electronic component may be dispersed or diffused over the whole heat transfer promoting base plate section with enhanced efficiency.

In a preferred embodiment of the present invention, the main material and heat transfer promoting material are previously formed integrally with each other by temporarily coupling the main material and heat transfer promoting material to each other at the time working of the workpiece is started and subjecting at least one of the main material and heat transfer promoting material to plastic deformation, to thereby permit both materials to bite or intermesh with each other. This ensures that the heat transfer promoting material is kept in close contact with the main material, resulting in heat generated from the electronic component being efficiently dispersed over the whole heat transfer promoting base plate section. Also, this permits the main base plate section and heat transfer promoting base plate section of the base plate to be integrally constructed together during forging under pressure, to thereby eliminate a separate step of coupling both sections to each other, leading to a reduction in manufacturing cost of the heat sink.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Now, the present invention will be described with reference to FIGS. 1 to 8.

The following description will be first made in connection with a heat sink of the present invention and then made in connection with a method for manufacturing the same according to the present invention.

Figure 1:
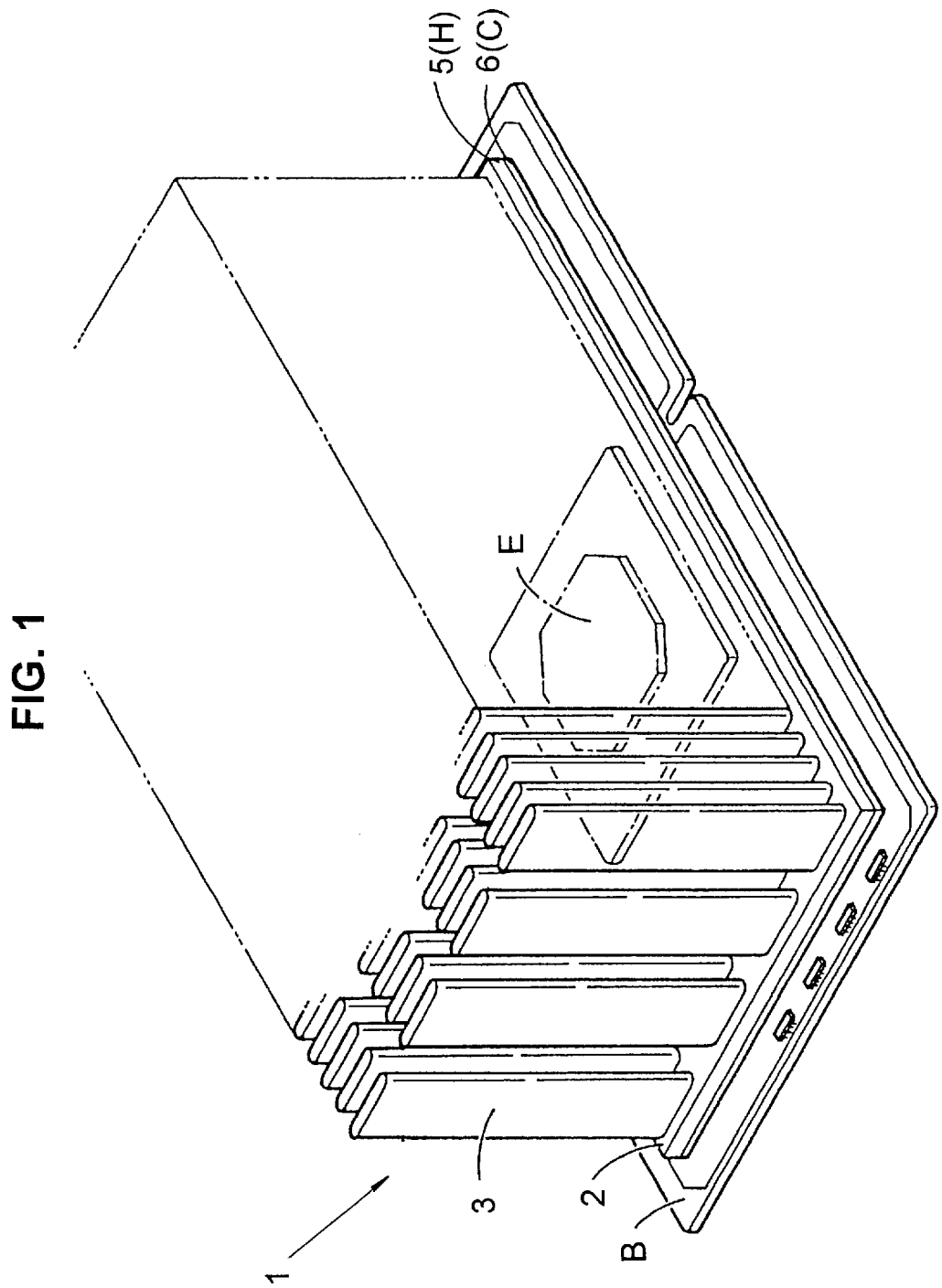
FIG. 1 is a schematic perspective view showing a manner of operation of an embodiment of a heat sink according to the present invention.

Referring first to FIG. 1, the manner of operation of a heat sink according to an embodiment of the present invention is illustrated. A heat sink of the illustrated embodiment which is generally designated by reference numeral 1 includes a base plate 2 and is so arranged that the base plate 2 is kept in intimate or close contact with an electronic component E increased in heat generation and mounted on a wiring substrate B. Thus, the heat sink 1 is kept in close contact with the electronic component E, so that heat generated from the electronic component E is received by the base plate 2 and then discharged or dissipated through the base plate 2 from radiation fins 3, resulting in the electronic component E being cooled.

Figure 2A:
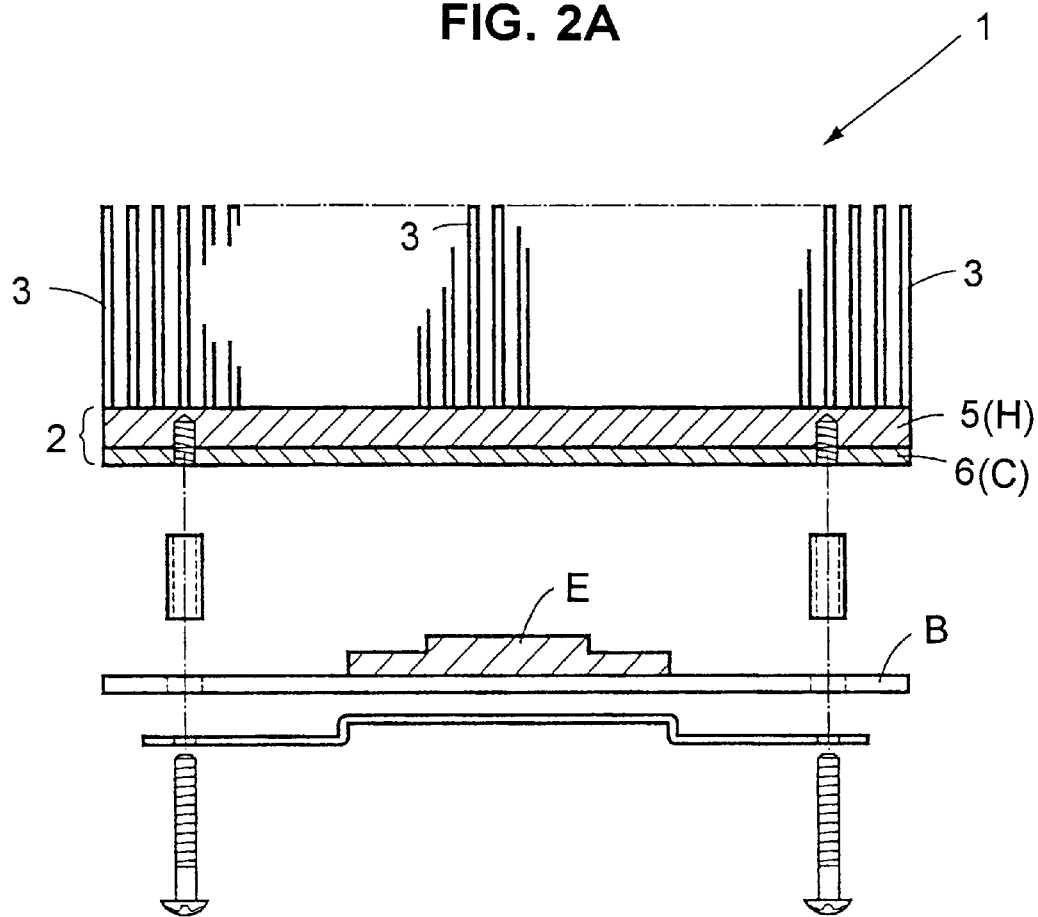
FIG. 2A is a schematic side elevation view in section of the heat sink shown in FIG. 1.
Figure 2B:
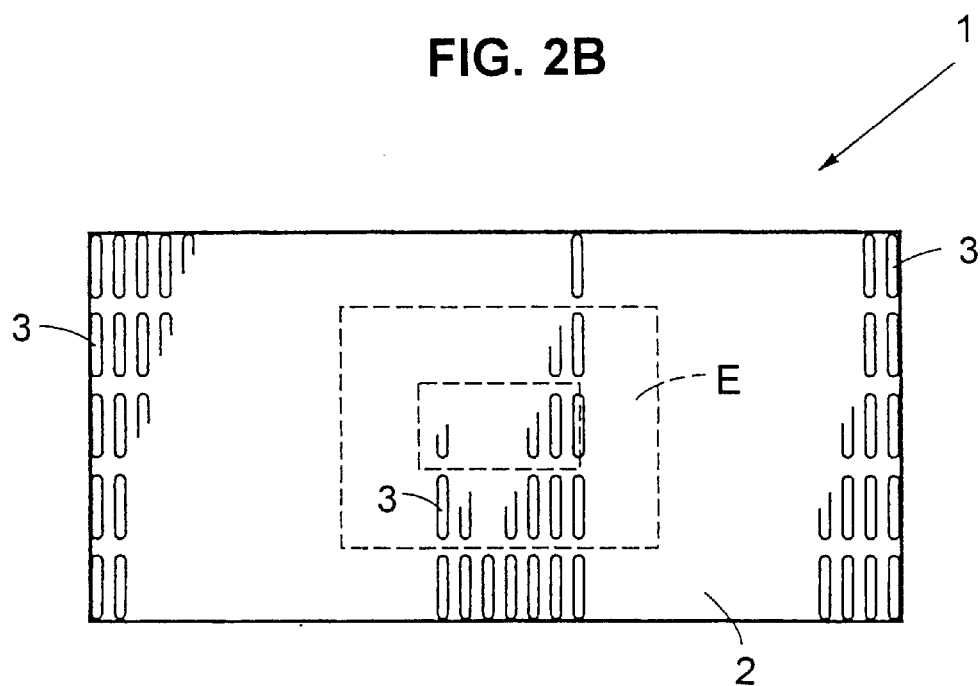
FIG. 2B is a schematic plan view of the heat sink shown in FIG. 1.

Now, the heat sink 1 of the illustrated embodiment will be described with reference to FIGS. 1 to 2B. The heat sink 1, as shown in FIGS. 2A and 2B, is formed by plastic forming in such a manner that a number of the radiation fins 3 are arranged on the base plate 2 of a rectangular shape so as to substantially perpendicularly extend therefrom.

The base plate 2 includes a main base plate section 5 on which the radiation fins 3 are formed and a heat transfer promoting base plate section 6 arranged on a surface of the main base plate section 5 opposite to a surface thereof on which the radiation fins 3 are arranged.

The radiation fins 3 and main base plate section 5 are made of a main material H and the heat transfer promoting base plate section 6 is made of a heat transfer promoting material C.

In the illustrated embodiment, the main material H may be aluminum alloy and the heat transfer promoting material C may be a material increased in thermal conductivity as compared with aluminum such as copper or alloy thereof.

Of course, the main material H may be copper or alloy thereof. In this instance, the heat transfer promoting material C is a material having thermal conductivity larger than copper or alloy thereof.

The main material H and heat transfer promoting material C are kept previously integrally coupled to each other at a stage at which working of a starting material for a workpiece (starting workpiece material) is started, which workpiece is designated by reference character $W_0$.

The term "workpiece" used herein indicates a metal material constituted by the main material H and heat transfer promoting material C which is at each of a starting stage, an intermediate stage during forging under pressure and a final stage. Thus, the workpieces include the starting workpiece material $W_0$, an intermediate workpiece material $W_1$ and a final workpiece material $W_2$.

Coupling the main material H and the heat transfer promoting material C to each other may be carried out using brazing, pressure welding by forging, deformation together with intermeshing or any combination thereof, which will be described in detail hereinafter.

In the heat sink 1 of the illustrated embodiment, the radiation fins 3 are formed to have a surface area tens of times as large as an area of the surface of the base plate 2 on which the radiation fins 3 are formed, so that the heat sink 1 may be highly increased in heat radiation or dissipation efficiency. Also, the base plate 2 is so constructed that a bottom surface area thereof is several times as large as an upper surface area of a package of the electronic component E to be cooled, so that the heat sink 1 may exhibit highly enhanced heat dissipation efficiency.

Now, an apparatus for manufacturing the heat sink 1 will be described with reference to FIGS. 3A and 3B. The heat sink manufacturing apparatus includes a die 10. The die 10, as shown in FIG. 3A, includes a force die member 12 for extruding the starting workpiece material $W_0$ and a forming die member 13 for forming the radiation fins 3.

The forming die member 13 is formed therein with a receiving recess 14 in which the starting workpiece material $W_0$ is received. The receiving recess 14 has a bottom acting as a press surface 16. The press surface 16 is formed with a number of forming holes 15. The receiving recess 14 is configured in the form of a continuous surface free from any seam or juncture. For formation of such a receiving recess 14 defined by the continuous surface, the forming die member 13 may be integrally formed. Alternatively, the forming die member 13 may be made by securely connecting a plurality of separate blocks to each other without defining any gap therebetween.

Figure 3A:
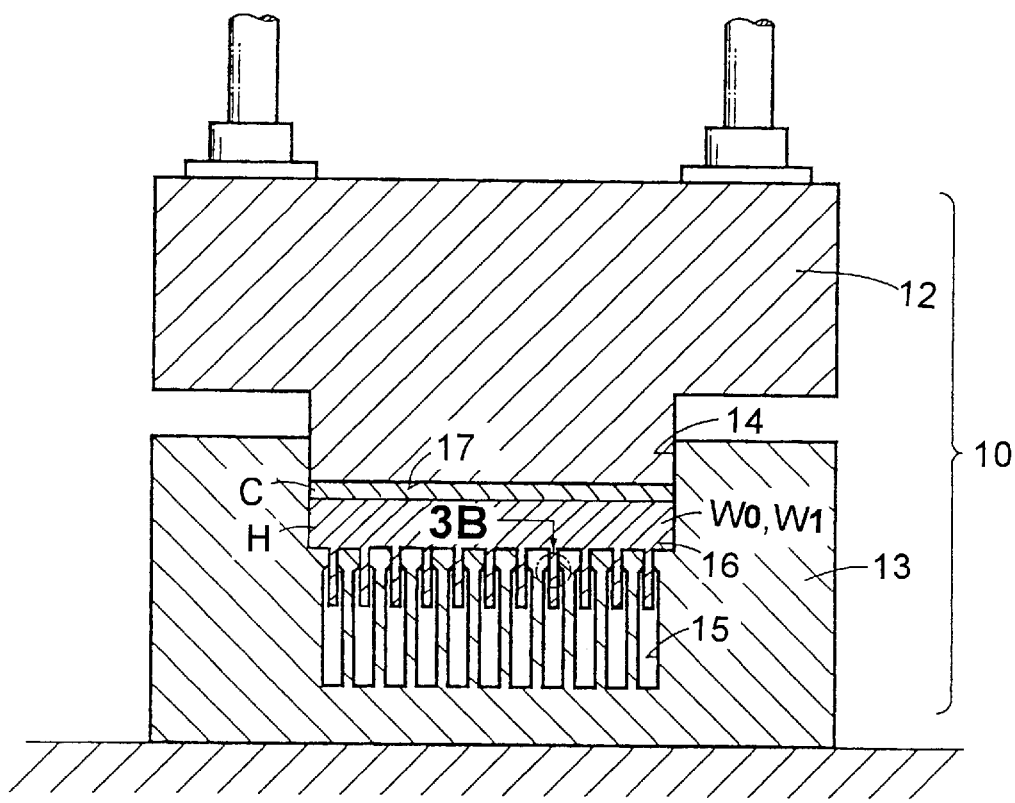
FIG. 3A is a front elevation view in section showing an apparatus for manufacturing a heat sink according to the present invention by way of example.
Figure 3B:
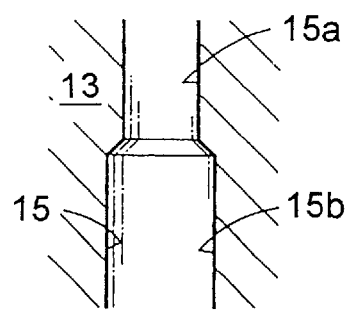
FIG. 3B is an enlarged view showing a region 3B enclosed with a circle in FIG. 3A.

The forming holes 15, as shown in FIG. 3B, are each so constructed that a side thereof initially abutted against the starting workpiece member $W_0$ or an upper side thereof in FIG. 3A functions as a constriction 15a determining a planar dimension of each of the radiation fins 3 like a flat plate. Also, the forming holes 15 are each formed so that a portion deep therein which is away from the constriction 15a or a lower portion thereof in FIG. 3A is increased in width as compared with the constriction 15a, resulting in an enlargement 15b being defined. The enlargement 15b is formed so as to extend from a lower end of the constriction 15a to a position near a lower surface of the forming die member 13.

The constriction 15a is formed to have a shape corresponding to or depending on a configuration of each radiation fin 3 of the heat sink 1.

The force die member 12 includes a forcing portion formed with a forcing contact surface 17. The forcing portion of the force die member 12 is fitted in the receiving recess 14 of the forming die member 13, so that the forcing contact surface 17 forces a part of the starting workpiece material W₀ into each of the forming holes 15.

Now, manufacturing of the heat sink by the heat sink manufacturing apparatus thus constructed will be described hereinafter.

(1) Production of starting workpiece material

First, in the illustrated embodiment, a metal plate in the form of a flat plate-like shape or a block-like shape is made of a metal material such as aluminum or the like, resulting in the main material H being provided.

Then, another metal plate of a flat plate-shape or a block-like shape is made of copper or alloy thereof which is a material having thermal conductivity larger than aluminum, to thereby provide the heat transfer promoting material C.

Subsequently, the main material H and heat transfer promoting material C are integrally joined or coupled to each other, so that the starting workpiece material W₀ to be filled in the receiving recess 14 of the heat sink manufacturing apparatus may be obtained.

Such coupling the main material H and the heat transfer promoting material C to each othere is carried out using brazing, pressure welding by forging, deformation together with intermeshing or any combination thereof.

Figure 4A:
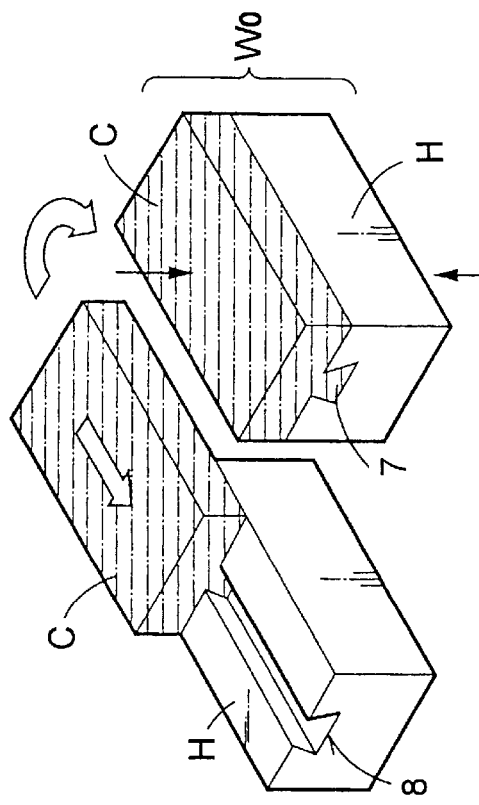
FIGS. 4A to 4D each are a perspective view showing coupling a main material and a heat transfer promoting material to each other to form a starting workpiece material.

The brazing, as shown in FIG. 4A, may be attained by bringing the main material H and heat transfer promoting material C into close contact with each other and then placing molten metal at a boundary between the materials H and C, to thereby join both materials to each other using flow and wetting characteristics of the molten metal without melting the main material H and heat transfer promoting material C.

More specifically, for example, when brazing is carried out by joining the heat transfer promoting material C made of copper and the main material H made of aluminum to each other by soldering, the main material H may be previously subjected to copper plating, nickel plating or the like to render a surface of the main material H solderable. Then, both materials are joined together by soldering.

It should be understood that a cost for the above-described plating made on the main material H is substantially reduced as compared with that for plating carried out after formation of radiation fins as described above in connection with the prior art and the plating is readily attained substantially without any trouble.

The pressure welding by forging is accomplished by bringing the main material H and heat transfer promoting material C into close or intimate contact with each other and then subjecting both to pressure welding using any suitable pressing machine.

Alternatively, the pressure welding may be carried out in such a manner that the main material H and heat transfer promoting material C are kept temporarily coupled to each other when working by the heat sink manufacturing apparatus is started, so that at least one of the main material H and heat transfer promoting member C may be subjected to plastic deformation during forming by the die 10, resulting in both materials being press-bonded together.

Figure 4B:
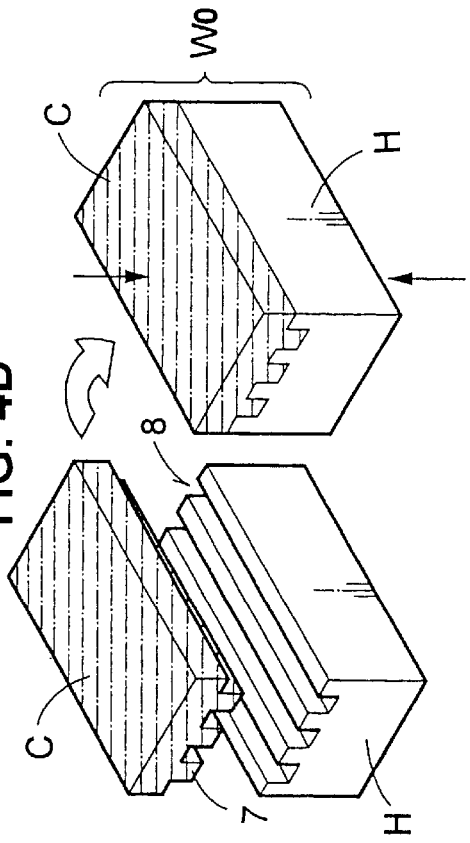

The deformation together with intermeshing, as shown in FIG. 4B, may take place by forming the main material H and heat transfer promoting material C with one of cylindrical projections 7 and recesses 8 like through-holes and the other, respectively, and fitting the projections 7 in the recesses 8 to closely contact the materials C and H with each other. Then, the projections 7 are subjected to plastic deformation by means of any suitable pressing machine, resulting in pressure welding between both materials C and H being carried out in a manner like riveting.

Figure 4C:
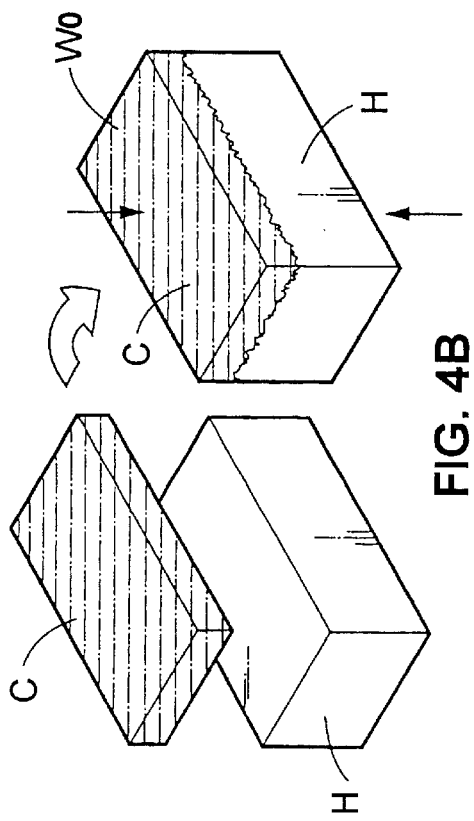

Alternatively, the deformation together with intermeshing, as shown in FIG. 4C, may be attained by forming the main material H and heat transfer promoting material C with one of a dovetail projection 7 and a dovetail groove 8 and the other, respectively, and then fitting the dovetail projection 8 in the dovetail groove 8. Then, both materials C and H are subjected to pressure welding using a pressing machine, resulting in them being press-bonded together.

Also, the deformation together with intermeshing may be carried out in such a manner that the main material H and heat transfer promoting material C are kept temporarily coupled to each other when working by the heat sink manufacturing apparatus described above is started and then at least one of the main material H and heat transfer promoting member C is subjected to plastic deformation during forming by the die 10, resulting in both being securely joined or coupled to each other.

Figure 4D:
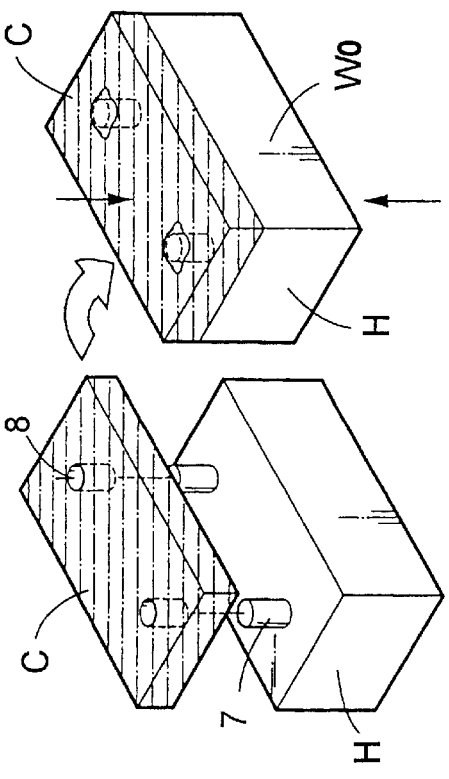

The main material H and heat transfer promoting material C each may be formed so as to permit a joint portion thereof to be increased in contact area, as shown in, for example, FIG. 4D. In FIG. 4D, the main material H and heat transfer promoting material C are formed on a whole joint surface thereof with one of elongated projections 7 and elongated recesses 8 and the other, respectively. Engagement between the projections 7 and the recesses 8 permits a contact surface between the main material H and the heat transfer promoting material C to be substantially increased. Thus, it will be noted that in the illustrated embodiment, the projections 7 and recesses 8 cooperate with each other to provide a means for increasing a contact area.

(2) Forming

Figure 5A:
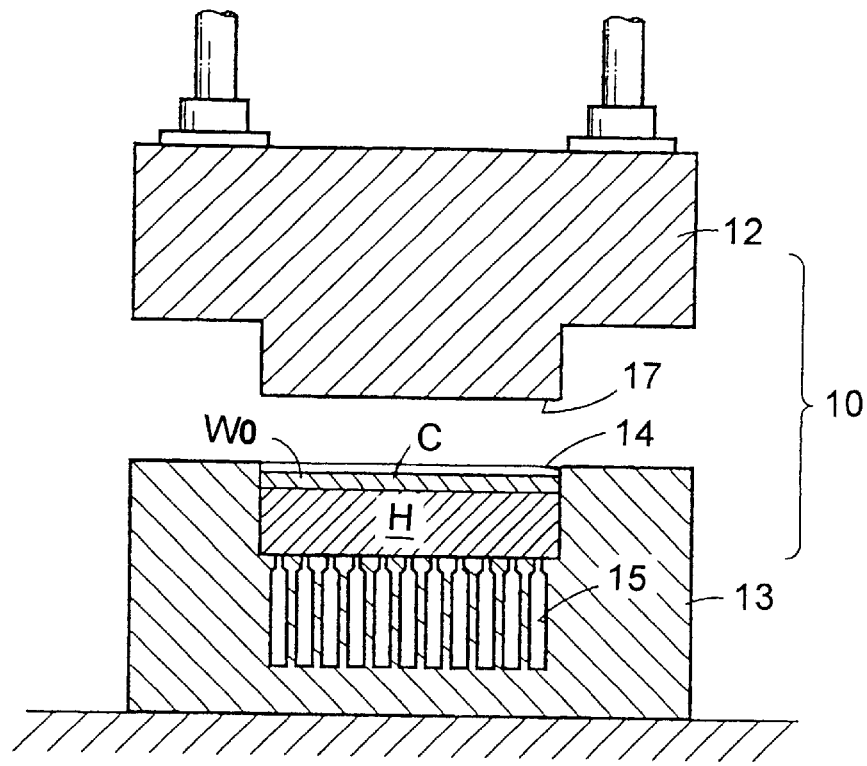
FIG. 5A is a front elevation view in section showing start of forming of radial fins in a method of the present invention.
Figure 5B:
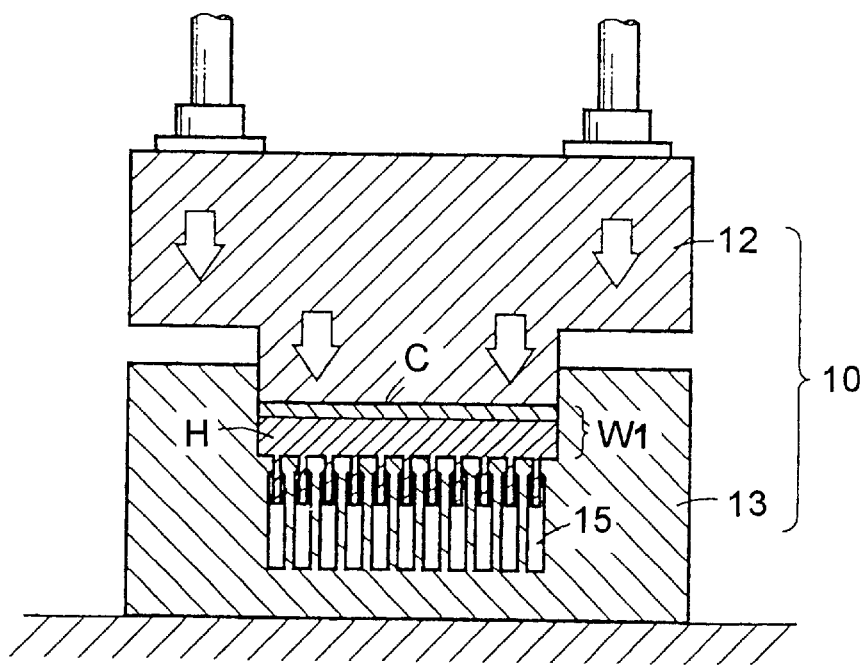
FIG. 5B is a front elevation view in section showing forming of the radiation fins in the method of the present invention.

Then, the starting workpiece material W₀, as shown in FIG. 5A, is placed in the receiving recess 14 of the forming die member 13 of the die 10. Thereafter, the forcing portion of the force die member 12 of the die 10 is fitted in the receiving recess 14, to thereby compress the starting workpiece material W₀ while forcing the forcing contact surface 17 against the material W₀. This permits a part of the main material H of the starting workpiece material W₀ to be drawn into the forming holes 15 of the forming die member 13, to thereby be deformed, so that forming may be carried out as shown in FIG. 5B. Then, the deformed material is downwardly moved, so that the radiation fins 3 may be formed.

(3) Completion of forming

Figure 6A:
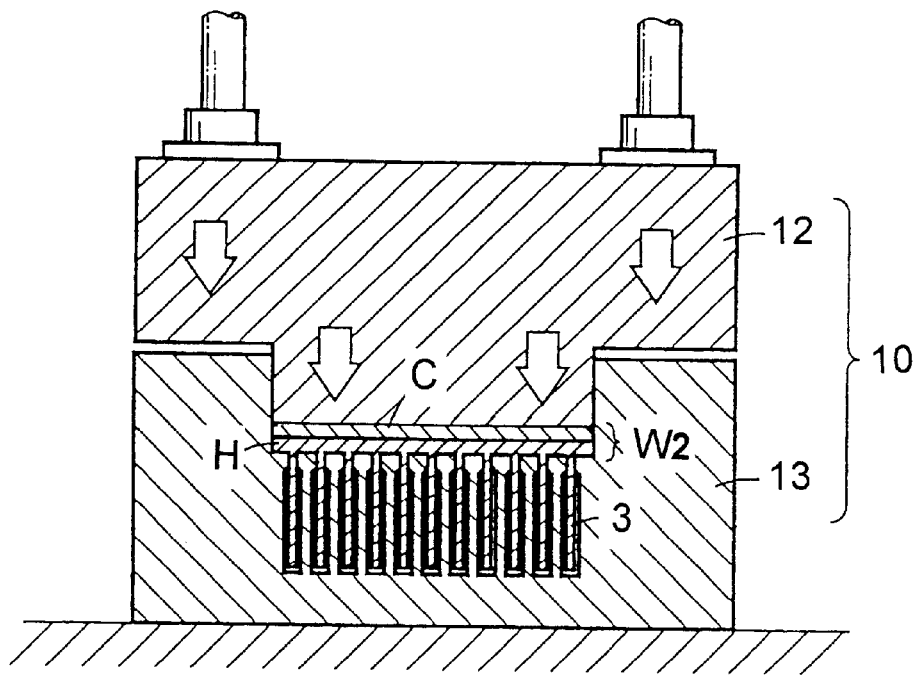
FIG. 6A is a front elevation view in section showing completion of the forming in the method of the present invention.

Extension of the radiation fins 3 to a position near the lower surface of the forming die member 13 permits the radiation fins 3 to be formed to have a predetermined length, so that the final workpiece material W₂ may be obtained as shown in FIG. 6A.

(4) Release of forming die member

Figure 6B:
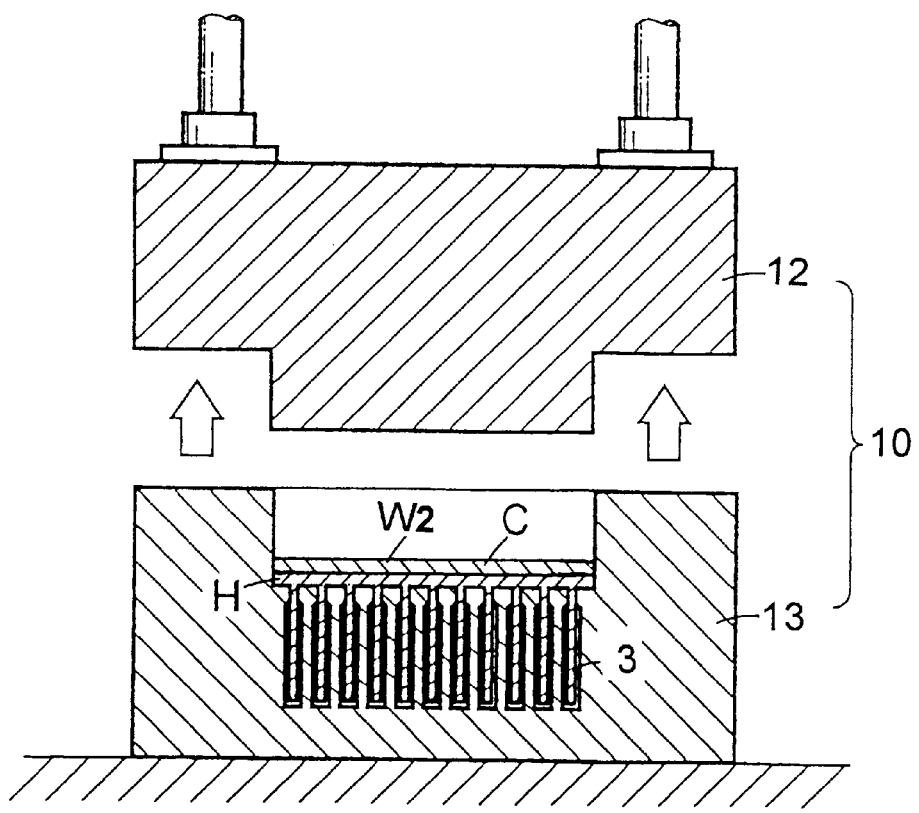
FIG. 6B is a front elevation view in section showing release of a die member from a forming die member in the method of the present invention.

After the final workpiece material W₂ is formed as described above, pressing by the force die member 12 is stopped and the force die member 12 is upwardly moved as shown in FIG. 6B.

(5) Release of die member

After the final workpiece material W₂ is released from the forming die member 13, it is subjected to working or processing ends of the radiation fins 3, painting and the like, resulting in the heat sink 1 which is a final product being obtained.

As will be noted from the above, manufacturing of the heat sink 1 by the illustrated embodiment eliminates a separate step of fixing the heat transfer promoting base plate section 6 on the main base plate section 5 and parts for the fixing such as screws or the like; because the heat transfer promoting material C is previously integrated with the main material H at a stage of the starting workpiece material $W_0$, to thereby ensure that the heat transfer promoting base plate section 6 is formed integrally with the main base plate section 5 concurrently with forming of the final workpiece material $W_2$. This leads to a reduction in manufacturing cost of the heat sink and prevents inadvertent bending of the radiation fins 3 which are inherently delicate.

Figure 7:
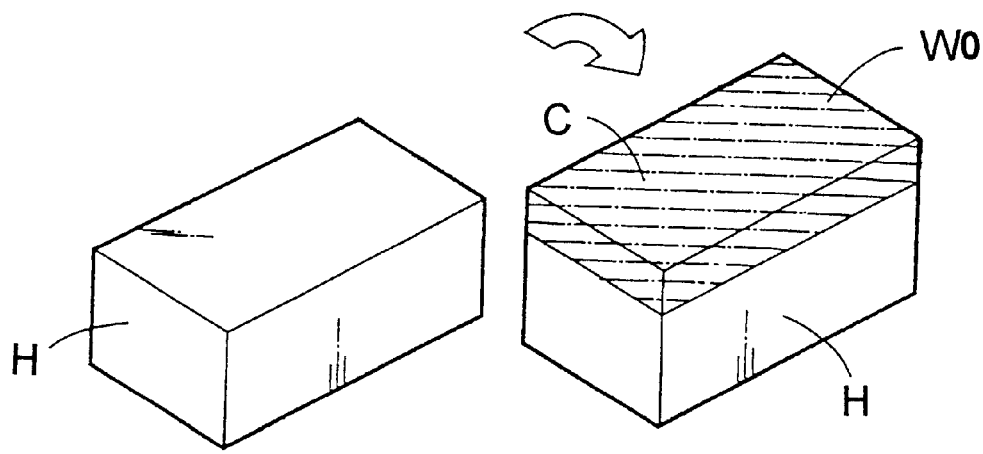
FIG. 7 is a perspective view showing forming a starting workpiece material by plating a heat transfer promoting material on a main material.

The present invention is not limited to the embodiment described above. Thus, it may be varied in various ways. For example, coupling the main material H and heat transfer C to each other may be attained by plating of the heat transfer promoting material C on the main material H, as shown in FIG. 7. This permits the heat transfer promoting material C to be highly intimately bonded or joined to the main material H, so that heat generated from the electronic component E may be more efficiently diffused or dispersed over the whole heat transfer promoting base plate section 6.

Figure 8:
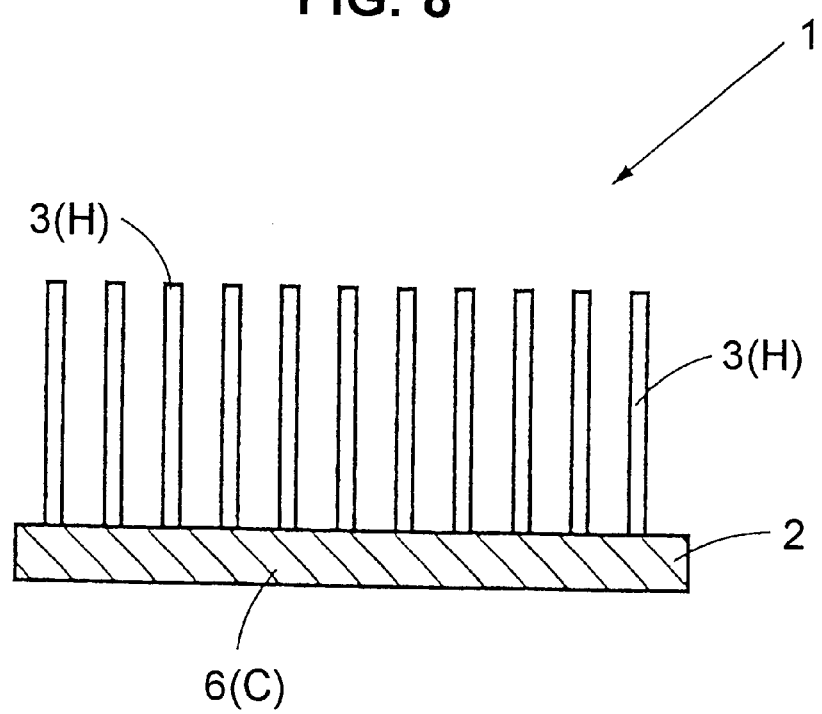
FIG. 8 is a side elevation view in section showing a heat sink which is so constructed that radiation fins are arranged so as to project directly from a heat transfer promoting base plate section.
Figure 9A:
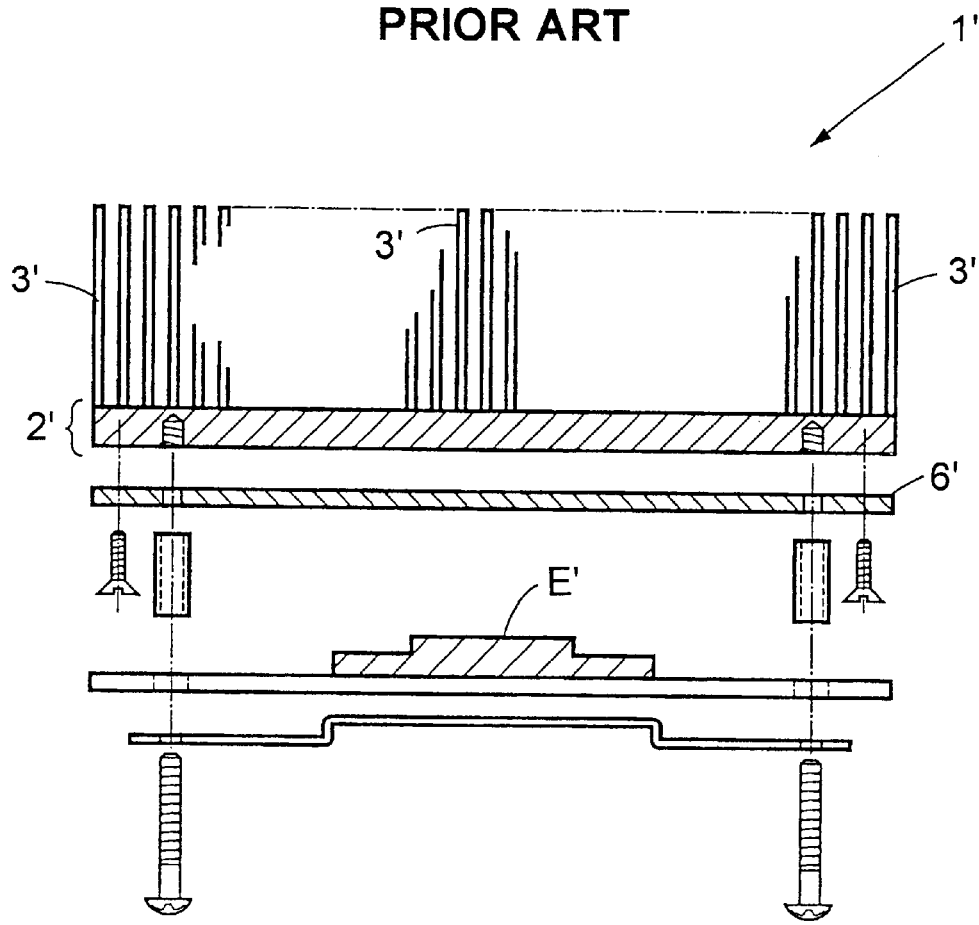
FIG. 9A is a side elevation view in section showing a conventional heat sink in which a heat transfer promoting metal plate is mounted on a base plate.
Figure 9B:
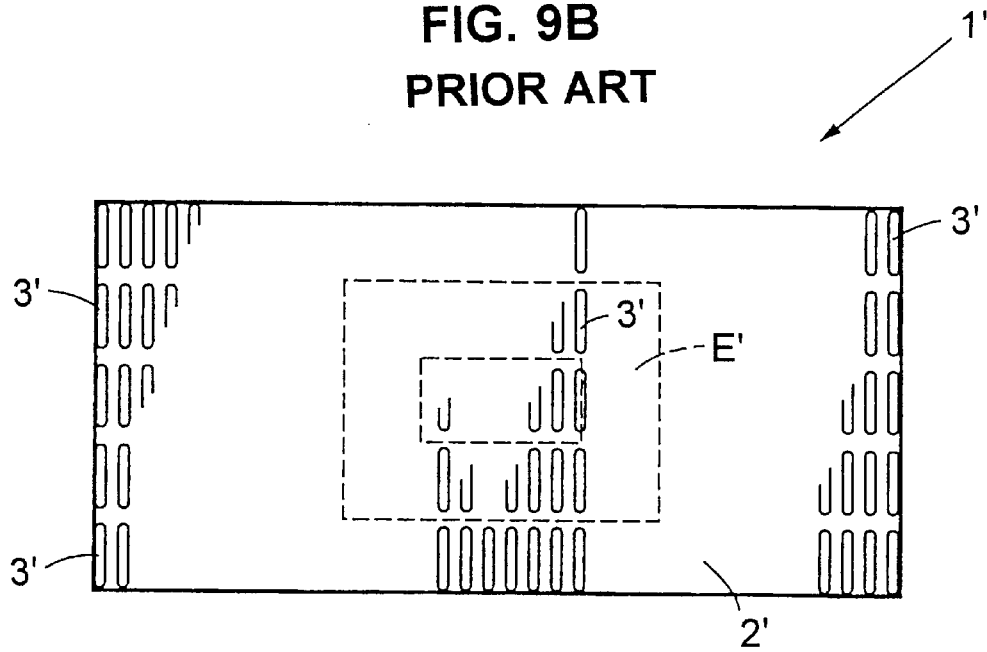
FIG. 9B is a plan view of the conventional heat sink shown in FIG. 9A.

Also, the radiation fins 3, as shown in FIG. 8, may be formed in a manner to project directly from the heat transfer promoting base plate section 6 or heat transfer promoting material C. Such construction may be realized, for example, by adjusting a volume of the heat transfer promoting material C so as to permit all the heat transfer promoting material C to be allocated to formation of the radiation fins 3 by plastic deformation. This permits heat generated from the electronic component E to be more efficiently dissipated from the radiation fins 3.

As can be seen from the foregoing, the present invention permits heat transfer from a heat generating source to the heat sink to be effectively promoted while reducing a manufacturing cost of the heat sink and increasing yields thereof.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A method for manufacturing a heat sink comprising the steps of:

joining integrally a heat transfer promoting material and a main material to form a workpiece, said heat transfer promoting material forming a base plate and having thermal conductivity larger than said main material; and forging said main material of said workpiece under pressure in a die to form radiation fins projecting from a surface of said base plate.

2. A method as defined in claim 1, wherein said joining step is accomplished by brazing.

3. A method as defined in claim 1, wherein said joining step is accomplished by plating said heat transfer material on said main material.

4. A method as defined in claim 1, wherein said joining step is accomplished by temporarily coupling said main material and heat transfer promoting material to each other and subjecting at least one of said main material and said heat transfer promoting material to plastic deformation to intermesh said main material and said heat transfer promoting material with each other.

5. A method as defined in claim 1, wherein said base plate includes a section made of said main material and said radiation fins project from said section.

6. A method as defined in claim 5, wherein said joining step is accomplished by brazing.

7. A method as defined in claim 5, wherein said joining step is accomplished by plating said heat transfer material on said main material.

8. A method as defined in claim 5, wherein said joining step is accomplished by temporarily coupling said main material and heat transfer promoting material to each other and subjecting at least one of said main material and said heat transfer promoting material to plastic deformation to intermesh said main material and said heat transfer promoting material with each other.

* * * * *

UNITED STATES PATENT AND TRADEMARK OFFICE
CERTIFICATE OF CORRECTION

PATENT NO. : 6,367,152 B1
DATED : April 9, 2002
INVENTOR(S) : Hiromi Kataoka

It is certified that error appears in the above-identified patent and that said Letters Patent is hereby corrected as shown below:

<u>Title page, Item [54] and Column 1, line 1,</u>
Title, "METHOD FOR MANUFACTURING A HEAT SINK" should read
-- HEAT SINK AND METHOD FOR MANUFACTURING SAME --.

<u>Column 7,</u>
Line 23, change "othere" to -- other --.

Signed and Sealed this

Twenty-ninth Day of October, 2002

*Attest:*

*Attesting Officer*

JAMES E. ROGAN
*Director of the United States Patent and Trademark Office*